US012224709B1

(12) United States Patent
Partridge et al.

(10) Patent No.: US 12,224,709 B1
(45) Date of Patent: Feb. 11, 2025

(54) CASCADED OSCILLATOR DESIGNS

(71) Applicant: SiTime Corporation, Santa Clara, CA (US)

(72) Inventors: Aaron Partridge, Cupertino, CA (US); Sassan Tabatabaei, Sunnyvale, CA (US); Lijun Chen, San Jose, CA (US); Kamran Souri, The Hague (NL)

(73) Assignee: SiTime Corporation, Santa Clara, CA (US)

( * ) Notice: Subject to any disclaimer, the term of this patent is extended or adjusted under 35 U.S.C. 154(b) by 0 days.

(21) Appl. No.: 18/498,671

(22) Filed: Oct. 31, 2023

Related U.S. Application Data

(60) Continuation of application No. 18/210,371, filed on Jun. 15, 2023, which is a division of application No. 17/712,096, filed on Apr. 2, 2022, now Pat. No. 11,716,055, which is a division of application No. 17/199,772, filed on Mar. 12, 2021, now Pat. No. 11,323,071, which is a division of application No. 16/807,952, filed on Mar. 3, 2020, now Pat. No. 11,005,422, which is a division of application No. 16/046,992, filed on Jul. 26, 2018, now Pat. No. 10,622,945.

(60) Provisional application No. 62/537,453, filed on Jul. 26, 2017.

(51) Int. Cl.
| | |
|---|---|
| *H03B 5/36* | (2006.01) |
| *G01C 19/56* | (2012.01) |
| *G01C 19/5726* | (2012.01) |
| *H03F 3/04* | (2006.01) |
| *H03F 3/70* | (2006.01) |

(52) U.S. Cl.
CPC .............. *H03B 5/36* (2013.01); *G01C 19/56* (2013.01); *G01C 19/5726* (2013.01); *H03F 3/04* (2013.01); *H03F 3/70* (2013.01); *H03B 2200/005* (2013.01); *H03F 2200/129* (2013.01)

(58) Field of Classification Search
CPC .... H03B 5/36; H03B 2200/005; G01C 19/56; G01C 19/5726; H03F 3/04; H03F 3/70; H03F 2200/129
USPC ........... 331/2, 46, 158, 117 FE, 116 M, 154; 73/580, 504.12
See application file for complete search history.

(56) References Cited

U.S. PATENT DOCUMENTS

| | | | |
|---|---|---|---|
| 5,659,269 A | 8/1997 | Meyers | |
| 6,741,137 B1 * | 5/2004 | Sibrai | ...................... H03B 5/36 331/109 |
| 8,375,789 B2 | 2/2013 | Prandi | |
| 8,922,288 B2 | 12/2014 | Brekelmans | |
| 10,622,945 B1 | 4/2020 | Partridge | |
| 11,005,422 B1 | 5/2021 | Partridge | |

(Continued)

OTHER PUBLICATIONS

Electro-mechanical Hybrid PLL, Gronicz et al Finnish URSI Convention on Radio Science Seminar 2013 (Year: 2013).*

(Continued)

*Primary Examiner* — Arnold M Kinkead

(57) ABSTRACT

An oscillator includes a resonator, sustaining circuit and detector circuit. The sustaining circuit receives a sense signal indicative of mechanically resonant motion of the resonator generates an amplified output signal in response. The detector circuit asserts, at a predetermined phase of the amplified output signal, one or more control signals that enable an offset-reducing operation with respect to the sustaining amplifier circuit.

31 Claims, 3 Drawing Sheets

(56) References Cited

U.S. PATENT DOCUMENTS 11,323,071 B1    5/2022   Partridge
2006/0033588 A1    2/2006   Caminada

OTHER PUBLICATIONS

Prandi et al., "A Low-Power 3-Axis Digital-Output MEMS Gyroscope with Single Drive and Multiplexed Angular Rate Readout," ISSCC 2011 / Session 6 / Sensors& Energy Harvesting / 6.1, IEEE International Solid-State Circuits Conference, ISSCC 2011, Digest of Technical Papers, San Francisco, CA, USA, Feb. 20-24, 2011, 3 pages.

* cited by examiner

Phase-complementary synchronous auto-zeroing sustaining amplifier (with or without cap-ratioed gain)

Synchronous auto-zeroing sustaining amplifier with cap-ratioed gain

Synchronous auto-zeroing sustaining amplifier

CASCADED OSCILLATOR DESIGNS

CROSS REFERENCE TO RELATED APPLICATIONS

This application is a continuation of U.S. Utility patent application Ser. No. 18/210,371, filed Apr. 2, 2022, which in turn is a continuation of U.S. Utility patent application Ser. No. 17/712,096, filed Apr. 2, 2022 (now U.S. Pat. No. 11,716,055), which in turn is a division of U.S. Utility patent application Ser. No. 17/199,772, filed Mar. 12, 2021 (now U.S. Pat. No. 11,323,071), which in turn is a division of U.S. Utility patent application Ser. No. 16/807,952, filed Mar. 3, 2020 (now U.S. Pat. No. 11,005,422), which in turn is a division of U.S. Utility patent application Ser. No. 16/046,992, filed Jul. 26, 2018 (now U.S. Pat. No. 10,622,945), which in turn claims priority to U.S. provisional application No. 62/537,453 filed Jul. 26, 2017; each of the aforementioned patent applications is hereby incorporated by reference.

TECHNICAL FIELD

The disclosure herein relates to timing signal generation.

DRAWINGS

The various embodiments disclosed herein are illustrated by way of example, and not by way of limitation, in the figures of the accompanying drawings and in which like reference numerals refer to similar elements and in which.

DETAILED DESCRIPTION

Resonator-based oscillators having reduced 1/f noise corners are disclosed in various embodiments herein. In a number of implementations, the 1/f noise corner frequency (fc) is lowered by active mitigation or canceling of a time-varying offset within a sustaining amplifier—an offset cancelation/reduction that lowers the 1/f noise corner from ~5 KHz to less than 10 Hz in some embodiments, and to less than 1 or 2 Hertz in other embodiments, in either case reducing near phase noise (phase noise at low frequency) of the resonator-based oscillator by 20 to 30 dB or more relative to conventional resonator-based oscillators.

Figure 1:
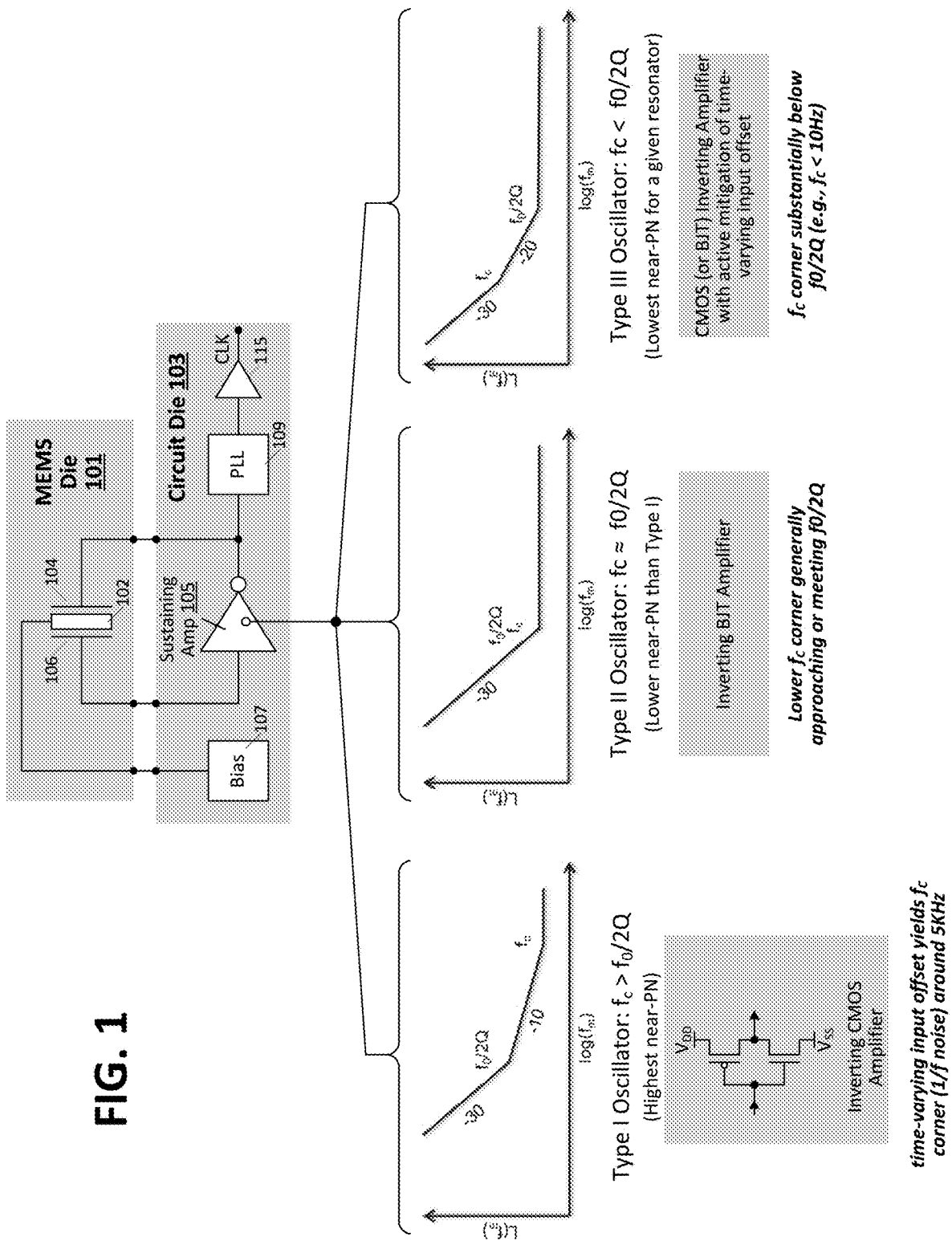
FIG. 1 illustrates a resonator-based oscillator in which 1/f corner reduction circuitry may be deployed.

FIG. 1 illustrates a resonator-based oscillator in which 1/f corner reduction circuitry may be deployed. In the exemplary two-die implementation shown, a microelectromechanical system (MEMS) resonator 102 is implemented in a first "MEMS" die 101 and circuitry for driving the MEMS resonator into mechanically resonant motion (i.e., "actuating" the resonator), sensing the resonator motion and producing a timing signal/clock signal (CLK) based on the sensed motion is disposed in a separate "circuit" die 103. The MEMS die and circuit die may be packaged together in various multi-die package configurations (e.g., side-by-side or stacked packages), including configurations in which the circuit die defines part of a resonator-encapsulating chamber. Also, other types of resonators may be used (quartz, inductor, thermal or resistor-based resonators) may be used The MEMS die depicted in FIG. 1 includes a voltage-biased electrostatic resonator. A sustaining amplifier 105 within circuit die 103 drives a time-varying signal at one or more "drive" electrodes 106 disposed in proximity to the resonator (mechanically resonant structure) receives an input signal via one or more "sense" electrodes 108 also disposed in proximity to the resonator. In a number of embodiments, the drive and sense electrodes are disposed adjacent opposite resonator amplitudes (i.e., maximum positive and negative displacements from neutral or resting position). The sense and drive electrodes are configured so that they can transduce motion to sense current or voltage (the sense side), and transduce voltage or current to force (the drive side). Various MEMS resonators can be used. In the exemplary embodiment, an electrostatic resonator is shown. The invention also works with other resonators, e.g. piezoelectric, or thermal. Or indeed for non-MEMS resonators such as quartz crystals, or electrical resonators such as inductor-capacitor tanks (LC) tanks.

An output also delivered, as the amplified resonator signal, to an optional clock multiplying circuit (an integer-N or fractional-N PLL 109 in this instance) to produce a frequency-multiplied output clock (i.e., resonator output multiplied by N). Optional output driver 115 delivers the output clock to other circuitry disposed within the circuit die and/or one or more other integrated circuit dies. Biasing circuit 107 establishes a known bias voltage on the resonant MEMS structure thus enabling a controlled electrostatic potential between the MEMS die and drive signal. For example, if the drive signal swings between ground and VDD supply rail potentials, the MEMS resonator may be biased at VDD/2 to yield balanced electrostatic attraction and repulsion (i.e., between the resonator and the drive electrode, the latter being implemented within a non-moving field area of the MEMS die) during opposite phases of the drive cycle.

FIG. 1 also illustrates three classes of oscillators distinguished by spectral relation between Leeson integration corner (201 output frequency divided by twice the quality factor, $f_0/2Q$) and 1/f noise corner (fc) with class distinctions effected primarily through changes in sustaining amplifier implementation. In the type I oscillator, a CMOS (complementary metal oxide semiconductor) inverter forms the core of the sustaining amplifier. The inverter exhibits a time-varying input offset that yields a 1/f noise corner at approximately 5 KHz (1 KHz to 10 KHz typical) well beyond the ~100 Hz Leeson integration frequency. In the type II oscillator, an inverting amplifier implemented with bipolar junction transistors (BJTs) exhibits a 1/f corner generally approaching or meeting the Leeson integration corner (~100

Hz) and substantially lower near phase-noise than the type I implementation. To achieve type III operation (1/f corner is substantially below the Leeson integration frequency), circuitry is provided in conjunction with a CMOS or BJT amplifier to actively mitigate (reduce, cancel or eliminate) the time-varying input offset—an approach that yields a 1/f corner below 10 Hz (or even below 2 Hz or 1 Hz) and the lowest near phase-noise for a given resonator.

Figure 2:
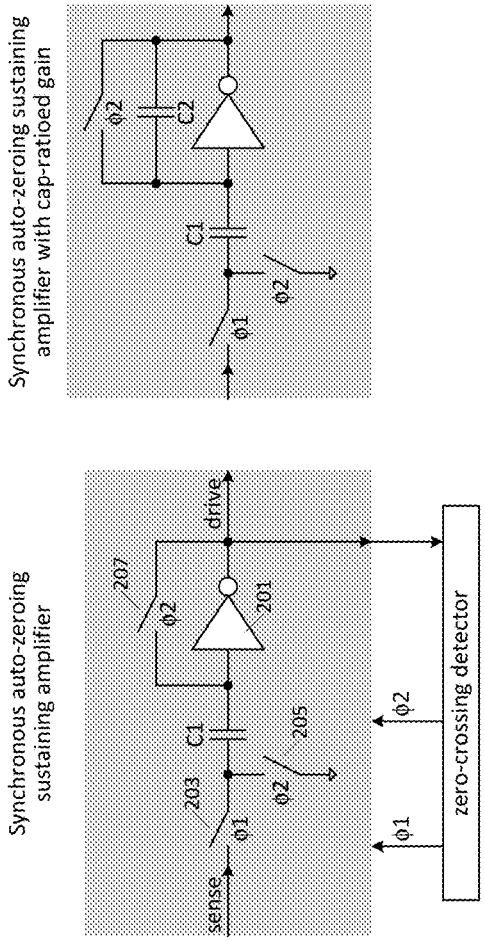
FIG. 2 illustrates an embodiment of an auto-zeroing sustaining amplifier that may be deployed as the sustaining amplifier in FIG. 1 to yield low Allan-Deviation performance.

FIG. 2 illustrates an embodiment of an auto-zeroing sustaining amplifier that may be deployed as the sustaining amplifier in FIG. 1 to yield type III oscillator performance (i.e., exceedingly low near phase-noise and thus low Allan Deviation). In the depicted implementation, a zero-crossing detection circuit detects passage of the resonator through the neutral point (rest point midway between the extreme positions in the resonator swing), asserting controls signal $\phi 1$ and $\phi 2$ at predetermined instants relative to the rising-edge and falling-edge zero-crossings and thus synchronously with respect to resonator oscillation. In one embodiment, the zero-crossing detector is implemented by a chain of inverters coupled to receive the sinusoidal resonator output (e.g., at the output of inverting amplifier 201 which may be implemented as shown in FIG. 1), with each inverter in the chain yielding a steeper (more square-wave like) output slew than its predecessor and the final inverter producing a square wave with a rising edge that transpires shortly after the ascending zero-crossing of the resonator signal and a falling edge shortly after the descending zero-crossing. Additional resonators may be provided within the chain to implement a multi-tap delay line (e.g., in an open loop or closed loop, the latter being a delay-locked loop), with selected inverter outputs providing complementary $\phi 1$ and $\phi 2$ signals. In the embodiment of FIG. 2, for example, the zero-crossing detector asserts $\phi 1$ for an interval that spans both the rising-edge and falling-edge zero crossings (deasserting $\phi 2$ during that interval) and then asserts $\phi 2$ (and deasserts $\phi 1$) for an interval that commences following the falling-edge zero crossing and concludes prior to the rising-edge zero crossing, thus ensuring that the amplifier delivers a valid drive-signal output to both the resonator and the zero-crossing detector during the positive phase of the resonator signal (while the resonator is nearer the drive electrode than the sense electrode) and both zero crossings. To avoid glitch, a brief time delay may be instituted between deassertion of $\phi 1$ and assertion of $\phi 2$ (and/or vice-versa) so that the two control signals are not perfect complements.

Figure 3:
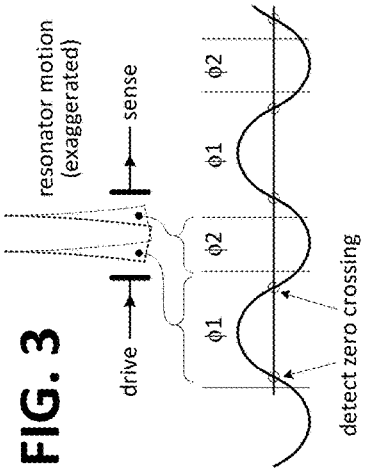
FIG. 3 illustrates the $\phi1$, $\phi2$ signal assertion overlaid with the resonator output, demonstrating the synchronous nature of the auto-zeroing operation in the FIG. 2 embodiment.
Figure 7A:
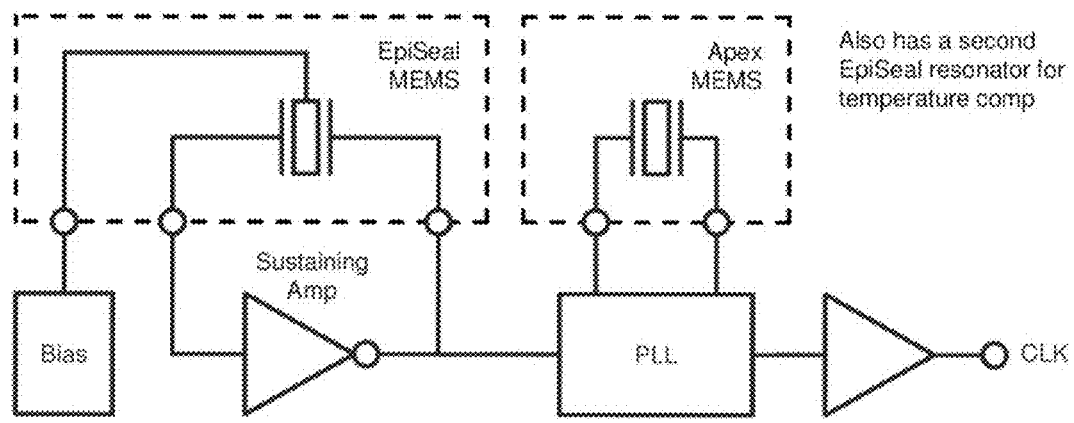
FIG. 7A illustrates a block diagram of a cascaded oscillator design.
Figure 7B:
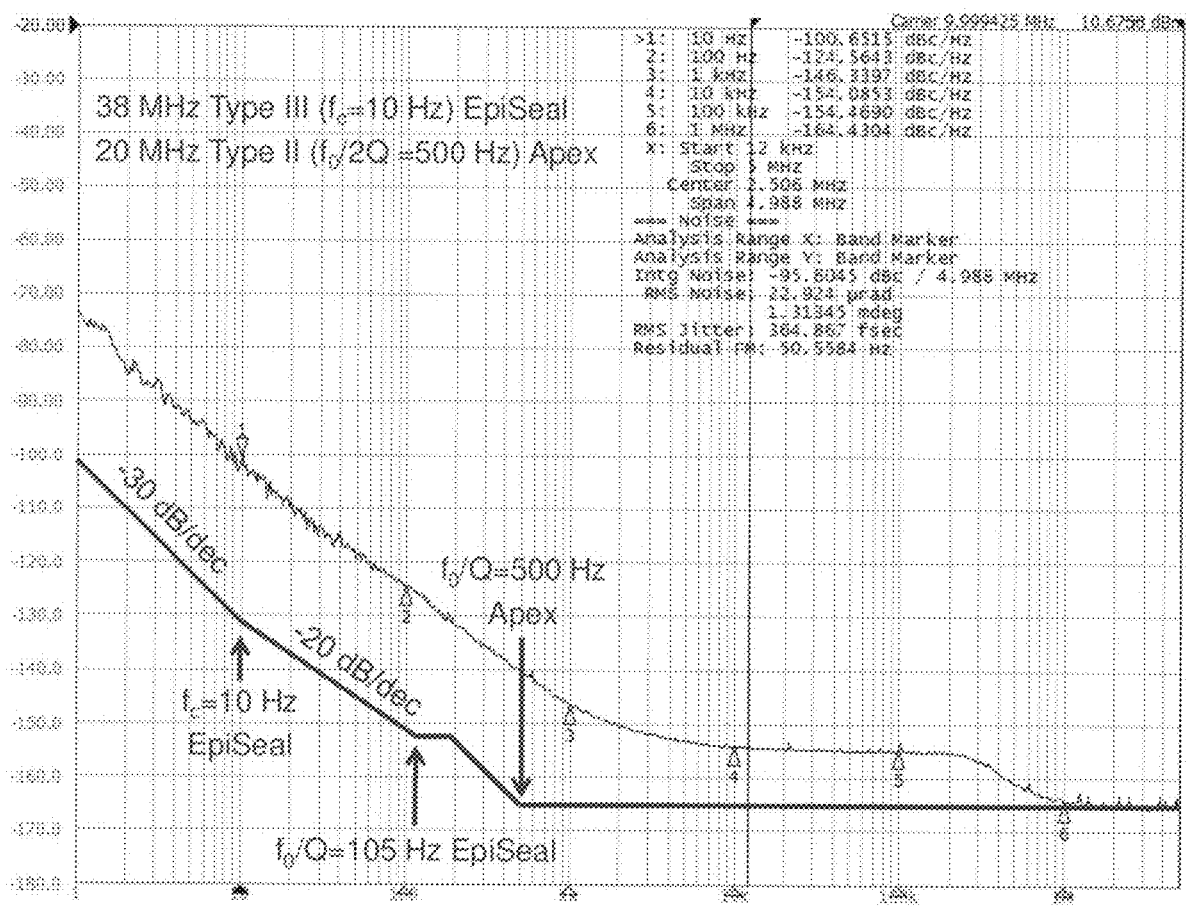
FIG. 7B illustrates noise plot for a cascaded resonator design having a 20 megahertz 'type II resonator' and a 38 megahertz 'type III resonator.'

Still referring to FIG. 2, the $\phi 1$ and $\phi 2$ signals effect sequential signal-amplification and offset-zeroing operations with respect to inverting amplifier 201 during each resonator cycle. More specifically, throughout the positive half-period of the resonator cycle (i.e., while the resonator is nearer the drive electrode than the sense electrode), $\phi 1$ is asserted to close switch 203 (e.g., implemented by one or more CMOS transistors) while $\phi 2$ is deasserted to open switches 205 and 207. During a portion of the negative half-period of the resonator cycle (i.e., following the descending zero-crossing and prior to the subsequent ascending zero-crossing, while the resonator is nearer the sense electrode than the drive electrode), $\phi 1$ is deasserted to decouple the amplifier from the sense electrode (opening switch 203), while $\phi 2$ is asserted to close switches 205 and 207. In this configuration, the input node of capacitor C1 is quieted (e.g., grounded) while the amplifier output is fed back to the amplifier input to zero any DC offset—a zeroing that, if carried out frequently enough, substantially reduces or even eliminates the time-varying amplifier offset that is otherwise the predominant 1/f noise contributor (i.e., lowering fc to less than 10 Hz or even less than 1 Hz and thus effecting type III oscillator operation). FIG. 3 illustrates the $\phi 1$, $\phi 2$ signal assertion overlaid with the resonator output, demonstrating the synchronous nature of the auto-zeroing operation in the FIG. 2 embodiment. That is, auto-zeroing is synchronized with resonator oscillation to ensure amplifier operation during zero crossings and the predominant drive interval (while the resonator has moved to the drive-electrode side of the neutral position) and to auto-zero the amplifier (zeroing or neutralizing the DC offset) during a portion of the resonator cycle outside the predominant drive interval and between zero crossings.

Figure 4:
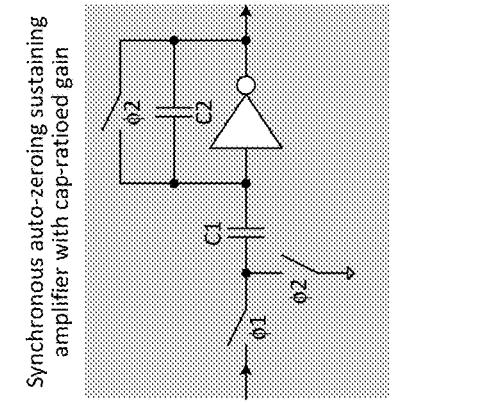
FIG. 4 illustrates an alternative implementation of a synchronous auto-zeroing sustaining amplifier, in this case having a capacitor C2 placed in the feedback path between amplifier output and input.

FIG. 4 illustrates an alternative implementation of a synchronous auto-zeroing sustaining amplifier, in this case having a capacitor C2 placed in the feedback path between amplifier output and input. In this integrating amplifier approach (capacitor C2 is charged and discharged by the inverter output during successive half-cycles of the resonator), the capacitance ratio between input capacitor C1 and integrating capacitor C2 (i.e., C2/C1) sets the amplifier gain. In addition to permitting potentially higher or precisely controlled gain than the embodiment of FIG. 2, the feedback capacitor may be implemented by a variable capacitance to provide for one-time or run-time programmable gain setting (e.g., by implementing the feedback capacitor with a switchably coupled branches of capacitance). Though not specifically shown, a zero-crossing detector may be coupled to/included as part of the auto-zeroing amplifier of FIG. 4 in the manner shown in FIG. 2, operating to produce control signals $\phi 1$ and $\phi 2$ generally as shown in FIG. 3.

The synchronous auto-zeroing amplifiers of FIGS. 2 and 4 are characterized by temporary disruption (disabling) of the amplifier output during the autozeroing interval. While this interval is shown to occur once per resonator cycle in FIG. 3, less-frequent auto-zeroing operations may be carried out—generally with any regularity sufficient to track and substantially zero the time-varying offset between input and output of the amplifier component. Moreover, to avoid or limit spurs in the spectral output of the oscillator, randomizing (or pseudo-randomizing) circuitry such as a pseudo-random bit sequence (PRBS) generator or delta-sigma modulator may be provided to trigger auto-zeroing operation once per desired interval but at a random time within that interval (or at random intervals).

Figure 5:
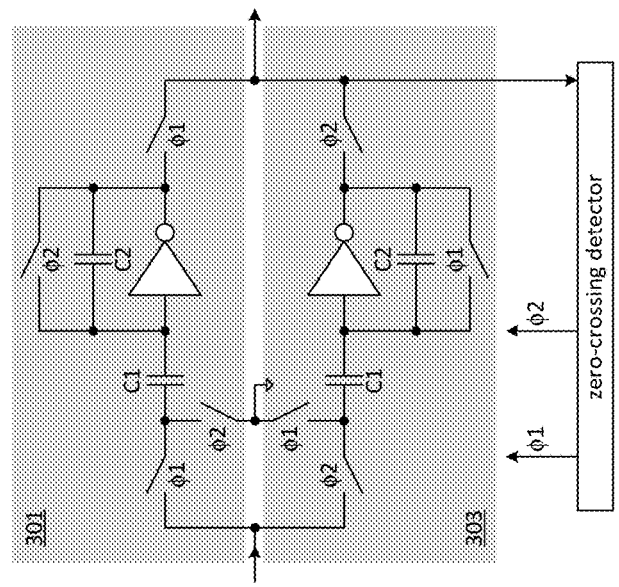
FIG. 5 illustrates an alternative approach in which parallel inverting amplifiers are operated in pipelined fashion to provide a seamless or relatively seamless output.
Figure 6:
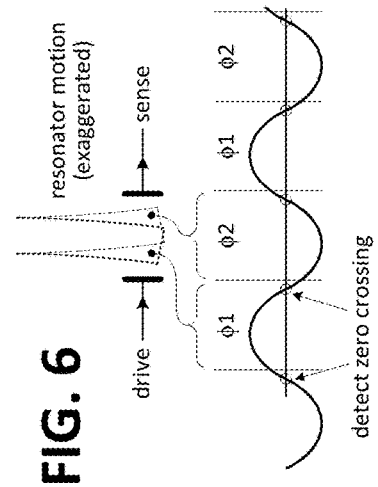
FIG. 6 illustrates an exemplary zero-crossing waveform showing the balanced switching of the $\phi1$ and $\phi2$ control signals.

FIG. 5 illustrates an alternative approach in which parallel inverting amplifiers are operated in pipelined (or parallel) fashion to provide a seamless or relatively seamless output (i.e., no temporary disruption during auto-zeroing). More specifically, two synchronous auto-zeroing amplifiers (or amplifier "stripes" 301 and 303) are coupled in parallel between input and output nodes and operated in complementary fashion—one auto-zeroing amplifier alternating between amplifier-output and auto-zeroing operation while the other auto-zeroing amplifier alternates between those operations in time-staggered order, auto-zeroing while the first amplifier generates an output and generating an amplified output while the first amplifier auto-zeroes. FIG. 6 illustrates an exemplary zero-crossing waveform showing the balanced switching of the $\phi 1$ and $\phi 2$ control signals. As can be seen the two signals are applied alternately within the two auto-zeroing amplifiers with $\phi 1$ asserted to configure amplifier stripe 301 for amplifier output and to configure stripe 303 for auto-zeroing, and $\phi 2$ asserted to produce the reverse configuration (stripe 301 auto-zero, stripe 303 amplifier output).

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, signal path widths, signaling or operating frequencies, component circuits or devices and the like can be different from those described above in alternative embodiments. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

It should be understood that the amplifiers described here are exemplary, and various detailed auto-zero amplifier embodiments are known in the art. Various oscillator topologies are also known in the art. One core invention described herein is to apply an auto-zero amplifier, whether of a presently known or unknown design, switched in a synchronous manner, to decrease the 1/f corner of the amplifier and thereby decrease the phase noise of the oscillator to a lower value than it would be without a switched amplifier.

What is claimed is:

1. An oscillator integrated circuit device comprising:
a first microelectromechanical systems (MEMS) resonator that produces a first timing signal;
a second MEMS resonator that produces a second timing signal;
a locked-loop circuit that receives each of the first timing signal and the second timing signal; and
wherein the locked-loop circuit produces an output timing signal that tracks phase noise of the first resonator below a first frequency and that tracks phase noise of the second resonator above the first frequency; and
wherein the first MEMS resonator is characterized by lower near phase noise than the second MEMS resonator.

2. The oscillator integrated circuit device of claim 1 wherein the first timing signal has a frequency dependent on a sensed frequency of the first MEMS resonator.

3. The oscillator integrated circuit device of claim 2 wherein the second timing signal has a frequency dependent on a sensed frequency of the second MEMS resonator.

4. The oscillator integrated circuit device of claim 1 wherein a first one of the first MEMS resonator and the second MEMS resonator produces a frequency that is greater than 35 megahertz and a second one of the first MEMS resonator and the second MEMS resonator produces a frequency that is less than 35 megahertz.

5. The oscillator integrated circuit device of claim 1 wherein:
the oscillator integrated circuit device further comprises at least one structure that is to serve as a temperature sensor;
the first timing output signal has a temperature corrected frequency, derived from a sensed frequency of the first MEMS resonator and temperature as measured by the temperature sensor.

6. The oscillator integrated circuit device of claim 5 wherein the at least one structure comprises the first MEMS resonator and a third MEMS resonator.

7. The oscillator integrated circuit device of claim 6 wherein at least one of the first MEMS resonator and the third MEMS resonator is a piezoelectric resonator.

8. The oscillator integrated circuit device of claim 6 wherein at least one of the first MEMS resonator and the third MEMS resonator is an electrostatic resonator.

9. The oscillator integrated circuit device of claim 1 wherein the second MEMS resonator comprises a piezoelectric resonator.

10. The oscillator integrated circuit device of claim 1, further comprising a temperature compensated oscillator, the temperature compensated oscillator comprising the first resonator and producing the first timing signal.

11. The oscillator integrated circuit device of claim 1 wherein:
the oscillator integrated circuit device comprises a die;
the first MEMS resonator comprises a body on the die, the body to deflect or vibrate during operation of the oscillator; and
the oscillator integrated circuit device further comprises circuitry comprising a sustaining amplifier circuit to provide a drive signal to excite the body to deflect or vibrate during operation of the device;

the circuitry is operable to assert a control signal that enables offset-cancellation for the sustaining amplifier circuit at times established as a function of the control signal; and the circuitry is to switch off the sustaining amplifier circuit during the times at which the offset-cancellation is enabled.

12. The oscillator integrated circuit device of claim 11 wherein:

the sustaining amplifier circuit is a first sustaining amplifier circuit, the times are first times, the control signal is a first control signal, and the offset cancelation is first offset cancellation;

the circuitry comprises a second sustaining amplifier circuit that is to provide a drive signal to excite the body to deflect or vibrate during operation of the oscillator;

the circuitry is further to assert a second control signal that enables for offset-cancellation for the second sustaining amplifier circuit at second times established as a function of the second control signal; and the circuitry is to switch off the second sustaining amplifier circuit during the second times.

13. The oscillator integrated circuit device of claim 12 wherein the circuitry is to switch on the first sustaining amplifier circuit and is to switch on the second sustaining amplifier circuit at mutually-exclusive times.

14. The oscillator integrated circuit device of claim 12 wherein the body is to vibrate with a frequency of vibration and wherein the first offset cancellation and the second offset cancellation are each applied at the frequency of vibration, at predetermined, respective phases.

15. The oscillator integrated circuit device of claim 12 wherein the body is to vibrate with a frequency of vibration and wherein the first offset cancellation and the second offset cancellation are each applied at respective phases of an offset cancellation frequency, the offset cancellation frequency being less than the frequency of vibration.

16. The oscillator integrated circuit device of claim 11 wherein the body is to vibrate with a frequency of vibration and wherein the offset cancellation is applied at the frequency of vibration, at a particular phase relative to the frequency of vibration.

17. The oscillator integrated circuit device of claim 11 wherein the body is to vibrate with a frequency of vibration and wherein the offset cancellation is applied at an offset cancellation frequency, the offset cancellation frequency being less than the frequency of vibration.

18. The oscillator integrated circuit device of claim 1 wherein the oscillator integrated circuit device further comprises a sustaining amplifier, the first timing signal dependent on operation of the sustaining amplifier, the sustaining amplifier having a bipolar junction circuit structure.

19. The oscillator integrated circuit device of claim 1 wherein the output timing signal is characterized by a 1/f noise corner that is at a lower frequency than the Leeson integration corner of the oscillator integrated circuit device.

20. The oscillator integrated circuit device of claim 19 wherein the 1/f noise corner is less than or equal to ten hertz.

21. The oscillator integrated circuit device of claim 1 embodied as a packaged integrated circuit device, further comprising a contact or pin to output a frequency-multiplied clock signal.

22. The oscillator integrated circuit device of claim 1 wherein the oscillator integrated circuit device comprises a sustaining amplifier, the first timing signal being dependent on operation of the sustaining amplifier, the sustaining amplifier and the first resonator forming a type III oscillator.

23. The oscillator integrated circuit device of claim 22 wherein the second resonator is characterized by lower far phase noise than the type III oscillator.

24. The oscillator integrated circuit device of claim 1 wherein the first resonator is an electrostatic resonator.

25. The oscillator integrated circuit device of claim 1 wherein the oscillator integrated circuit device comprises a sustaining amplifier, the first timing signal being dependent on operation of the sustaining amplifier, and wherein the sustaining amplifier and the first resonator form part of a temperature compensated oscillator.

26. An oscillator integrated circuit device comprising:

a first MEMS resonator that produces a first timing signal, the first MEMS resonator being an electrostatic resonator;

a second MEMS resonator that produces a second timing signal;

a locked-loop circuit that receives each of the first timing signal and the second timing signal, the locked-loop circuit configured to produce an output timing signal that tracks phase noise of the first resonator below a first frequency and that tracks phase noise of the second resonator above the first frequency; and a contact or pin to receive the output timing signal for output by oscillator integrated circuit device;

wherein the first MEMS resonator is characterized by lower near phase noise than the second MEMS resonator and wherein the second MEMS resonator is characterized by lower far phase noise than the first MEMS resonator.

27. The oscillator integrated circuit device of claim 26 wherein the second MEMS resonator is a piezoelectric resonator.

28. The oscillator integrated circuit device of claim 26 wherein:

the oscillator integrated circuit device further comprises a third MEMS resonator; and the oscillator integrated circuit device is to provide temperature compensation dependent on an output of the third MEMS resonator.

29. The oscillator integrated circuit device of claim 28 wherein the third MEMS resonator is an electrostatic resonator.

30. The oscillator integrated circuit device of claim 1 wherein the first frequency corresponds to a loop rate of the locked loop.

31. The oscillator integrated circuit device of claim 26 wherein the first frequency corresponds to a loop rate of the locked loop.

* * * * *